United States Patent
Agan et al.

(10) Patent No.: US 7,847,586 B2
(45) Date of Patent: Dec. 7, 2010

(54) INTEGRATE CIRCUIT CHIP WITH MAGNETIC DEVICES

(75) Inventors: Tom Allen Agan, Saint Paul, MN (US); James Chyi Lai, Saint Paul, MN (US)

(73) Assignee: Northern Lights Semiconductor Corp., St. Paul, MN (US)

(*) Notice: Subject to any disclaimer, the term of this patent is extended or adjusted under 35 U.S.C. 154(b) by 0 days.

(21) Appl. No.: 11/841,193

(22) Filed: Aug. 20, 2007

(65) Prior Publication Data

US 2009/0051386 A1 Feb. 26, 2009

(51) Int. Cl.
*H03K 19/173* (2006.01)
*H01L 25/00* (2006.01)

(52) U.S. Cl. .................. 326/38; 326/37; 326/47
(58) Field of Classification Search ........... 326/37–50, 326/101
See application file for complete search history.

(56) References Cited

U.S. PATENT DOCUMENTS

| | | | | |
|---|---|---|---|---|
| 5,191,241 A * | 3/1993 | McCollum et al. | | 326/41 |
| 5,656,548 A * | 8/1997 | Zavracky et al. | | 438/23 |
| 5,943,574 A * | 8/1999 | Tehrani et al. | | 438/300 |
| 6,288,565 B1 * | 9/2001 | Johnson | | 326/37 |
| 6,515,511 B2 * | 2/2003 | Sugibayashi et al. | | 326/41 |
| 6,539,059 B1 * | 3/2003 | Sriram et al. | | 375/240.25 |
| 6,573,713 B2 * | 6/2003 | Torok et al. | | 324/252 |
| 6,620,659 B2 * | 9/2003 | Emmma et al. | | 438/154 |
| 7,064,579 B2 * | 6/2006 | Madurawe | | 326/39 |
| 7,225,321 B2 * | 5/2007 | Bangert | | 712/37 |
| 7,274,207 B2 * | 9/2007 | Sugawara et al. | | 326/38 |
| 7,405,599 B2 * | 7/2008 | Agan et al. | | 326/104 |
| 7,436,218 B2 * | 10/2008 | Agan et al. | | 326/104 |
| 7,652,398 B2 * | 1/2010 | Koch et al. | | 307/407 |
| 2004/0250052 A1 * | 12/2004 | Bangert | | 712/227 |
| 2005/0102646 A1 * | 5/2005 | Madurawe | | 716/16 |
| 2005/0166035 A1 * | 7/2005 | Crum | | 712/25 |
| 2005/0181546 A1 * | 8/2005 | Madurawe | | 438/132 |
| 2006/0164124 A1 * | 7/2006 | Koch et al. | | 326/104 |
| 2006/0176620 A1 * | 8/2006 | Ravelosona et al. | | 360/324.2 |
| 2006/0275962 A1 * | 12/2006 | Lee | | 438/152 |
| 2007/0103191 A1 * | 5/2007 | Sugawara et al. | | 326/38 |
| 2007/0164781 A1 * | 7/2007 | Bangert et al. | | 326/38 |

FOREIGN PATENT DOCUMENTS

| | | |
|---|---|---|
| EP | 1 161 797 | 7/2008 |
| GB | 2 436 490 | 9/2007 |
| WO | WO 02/078100 | 10/2002 |

* cited by examiner

*Primary Examiner*—James H. Cho
*Assistant Examiner*—Matthew C Tabler
(74) *Attorney, Agent, or Firm*—Thomas, Kayden, Horstemeyer & Risley, LLP

(57) ABSTRACT

A logic gate array is provided. The logic gate comprises a silicon substrate, a first logic gate layer on top of the silicon substrate, a second logic gate layer on top of the first logic gate layer, and a routing layer between the first and second logic gate layers for routing magnetic gates in the first and second logic gate layers, wherein the first logic gate layer, the second logic gate layer, and the routing layer are electrically connected by vias.

14 Claims, 1 Drawing Sheet

US 7,847,586 B2

INTEGRATE CIRCUIT CHIP WITH MAGNETIC DEVICES

BACKGROUND

1. Field of Invention

The present invention relates to an integrate circuit chip. More particularly, the present invention relates to a chip with stacked magnetic devices.

2. Description of Related Art

Magnetic devices may be used as magnetic memory cells to stored data in a non-volatile fashion, which means the data written into the memory cells stays in the memory cells whether or not the circuit is powered. Therefore, magnetic devices are used as non-volatile memory elements such as flash memory, SRAM, DRAM, cache memory, hard drives . . . . etc. Not only does the magnetic devices be able to serve as memory elements, they may function as digital switches. The directions of the dipoles in the two magnetic layers of a magnetic device determines the conductivity of the device, thus the conductive state may be the "on" state of the switch, and the non-conductive state may be the "off" state of the switch.

The magnetic switches may be used to build logic gate as well as the transistors may be used. Conventional transistor logic gates are volatile, therefore, for example, if a system using field programmable gate array (FPGA) is built with transistor gates, separate system chips are required to store the program to implement the functions required. At, boot up, the FPGA needs to be reprogrammed to fit the task at hand. Performance of the FPGA system suffers due to these requirements.

Furthermore, transistor logic has a circuit density limit which the placement of the devices needs to be spread out due to routing concerns. Also, since transistor logic may only be implemented on the layer above the silicon substrate thus the integration of a large number of function blocks may not be practical due to chip area concerns.

For the forgoing reason, there is a need for a new logic design structure to reduce circuit density and integrate more function block such as CPU, memory, and logic gate arrays into a single chip.

SUMMARY

The present invention is directed to an integrated circuit chip, that is satisfies this need of increasing circuit density. The integrated circuit chip includes a central processing circuit layer, a sub processing circuit layer, a logic gate array layer, and a magnetic memory layer stacked on top of a silicon substrate, wherein all the layers are electrically connected by vias and the components in all the layers are magnetic devices. Each layer makes up different functions for an electronic system. In an integrated circuit chip, metal layers are formed on top of the transistor layers. Each function are designed using magnetic devices implemented in the metal layers of the integrated circuit chip, which the metal layers may be stacked on top of each other without interference in function. Thus, an embodiment of the present invention uses the stacking capability of the magnetic devices to create very high density integrated circuits. Because magnetic circuits can be stacked, each function can be implemented on a separate metal layer and with vias can communicate with the various stacks.

Furthermore, the embodiment of the present invention includes a logic gate array implemented using magnetic devices. The logic gate array is programmable and non-volatile, no additional system chips are required to store the programs, thus reprogramming is not necessary. The magnetic devices are used as logic gate and thus by dedicating one or more metal layers as logic gate layers, a programmable logic gate array may be implemented. Also routing of the gates may be done at a different layer, so that the device density at the logic gate layers may be higher.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
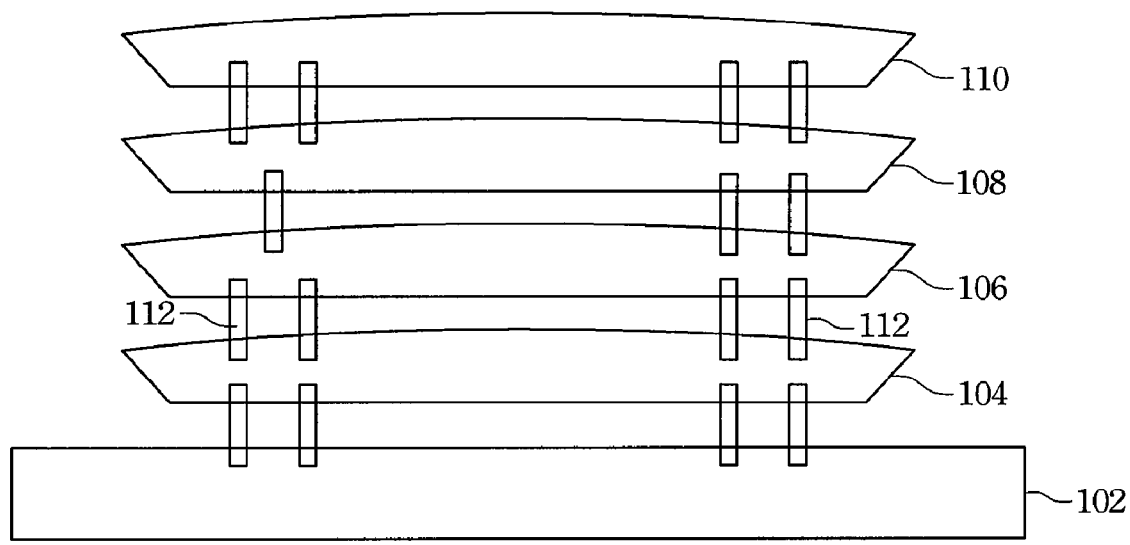
FIG. 1 is a side view of an integrate circuit according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Please refer to FIG. 1, a side view of a first embodiment of the present invention. An integrated circuit chip 100 is provided. The integrated circuit chip includes a silicon transistor layer 102. On top of the transistor layer 102 are stacked in sequence different system function blocks, which conventionally may be implemented in separate integrated circuit chips. The first layer on top of the substrate is a central processing circuit layer 104. Layer 104 may be the core circuitry to the system, for example, a central processing unit (CPU). Thus, the CPU may be implemented using magnetic devices in the metal layers above the silicon transistor layer transistor 102.

The next layer on top of layer 104 may be a magnetic memory layer 106, which may provide any form of memory function to the system. For example, the magnetic memory layer 106 may be designed into a static random access memory (SRAM), a dynamic random access memory (DRAM), cache memory, hard drive, or flash memory. The memory layer 106 may be electrically connected to the central processing circuit layer 104 through a via 112 connection between the metal layers, so that each function block may communicate with each other.

Similarly, a sub processing circuit layer 108 may be stacked on top of the magnetic memory layer 106 and connected with vias 112 therewith. The sub processing circuit layer 108 may implement functions such as digital signal processing (DSP) functions.

Figure 2:
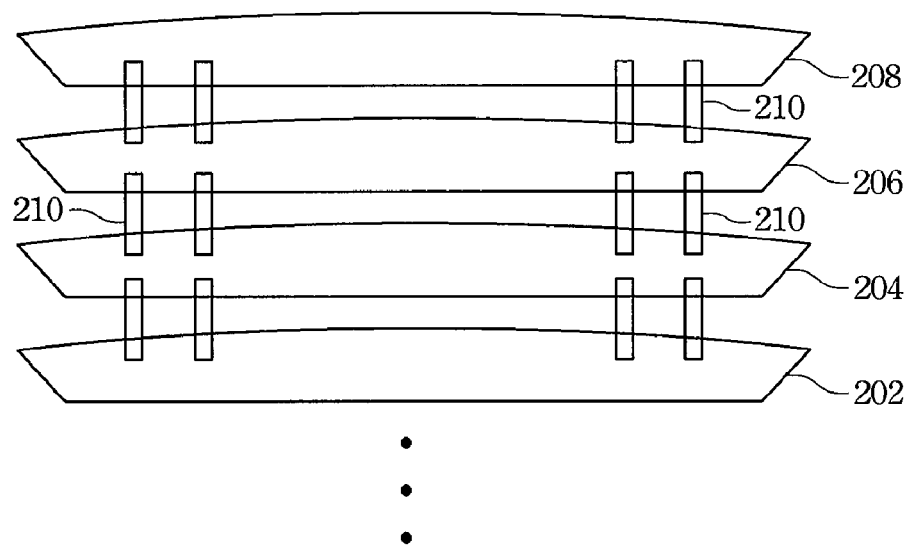
FIG. 2 is a side view of the logic gate array function block according to a second embodiment of this invention.

Moreover, a logic gate array layer 110 may be stacked on top of the sub processing circuit layer 108 to provide additional peripheral functions to the system. The logic gate array layer 110 may be implemented by logic gates designed using magnetic devices. The logic gates may be AND gates, OR gates, NAND gates, NOR gates, XOR gates, and XNOR gates. Please refer to FIG. 2, a side view of the logic gate function block according to a second embodiment of the present invention. The logic gate array layer 110 may be a single layer of a first logic gate layer 202 composed of logic gates stacked on top of other function blocks or on top of the silicon transistor layer 102. Alternatively, the logic gate array layer 110 may be expanded to multiple layers, so that an additional layer 204 may be dedicated for routing the universal gates in the first logic gate layer 202. The routing layer 204 may be stacked on top of the first logic gate layer 202 and connected by vias 210 therewith. Since the metal routing are fabricated in the routing layer 204, the first logic gate layer 202 may be designed with higher circuit density.

In the same fashion, a second logic gate layer 206 may be stacked on top of the routing layer 204 so that more universal gate may be implemented with a shared routing layer 204.

Furthermore, additional memory or other function blocks, such as layer 208 may be stacked onto the second logic gate layer 206 by the same stacking method disclosed by the embodiments of the present invention. The number of stacked layers and the sequence of stacking in the embodiments of the present invention are not meant to be limiting and any number of stacks and stacking sequences are within the scope of the present invention.

The embodiments of the present invention are an integrated circuit chip which combines large function blocks of circuits onto the same chip. The integrated circuit chip may decrease the price for complex systems because it potentially removes many chips form the circuit board. The chip also improves the speed of operation because the IC does not need to go off-chip to communicate with other major blocks of the system and also because magnetic devices are much faster than standard memories. This design can be used for very low power designs in particular because the entire system can have its power removed and having it back on within a very short time with the data still in tack. Once the gates are configured to a particular application, the configuration remains till changed, even with power removed. Thus many applications can be programmed at the factory and the programming will be kept regardless of the numbers of times the power supply switches. The logic gate array, namely, the magnetic adaptive programmable array (MAPA) of the present invention therefore provides a new structure for creating application specific integrated circuits (ASICs).

Lastly, because the magnetic devices consumes very low power, the heat dissipation issue for such high density circuits may not have as significant impact as anticipated. Moreover, heat is dissipated in the metals area and metal dissipates heat efficiently. Another advantage of the embodiments of the present invention is that since the integrated circuit may be purely designed with magnetic devices in the metal layers, the chip may be able to stand higher temperatures due to the fact that metal has a higher operating temperature than silicon.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A logic gate array, comprising:
   a silicon transistor layer;
   a first logic gate layer on top of the silicon substrate;
   a second logic gate layer on top of the first logic gate layer, the first logic gate layer and the second logic gate layer being conductive layers; and
   a routing layer between the first and second logic gate layers for routing magnetic gates in the first and second logic gate layers, wherein the first logic gate layer, the second logic gate layer, and the routing layer are electrically connected by vias, the components in all the layers are magnetic devices, and the magnetic devices are disposed in conductive layers.

2. The logic gate array of claim 1, wherein the first and second logic gate layers are implemented by AND gates, OR gates, NAND gates, NOR gates, XOR gates, and XNOR gates.

3. The logic gate array of claim 2, wherein the AND gates, OR gates, NAND gates, NOR gates, XOR gates, and XNOR gates are implemented by magnetic devices.

4. The logic gate array of claim 1, further comprising a memory layer on top of and electrically connected to the second logic gate layer.

5. The logic gate array of claim 4, wherein the memory layer is comprised of magnetic devices.

6. The logic gate array of claim 1, wherein the logic gate array is a magnetic adaptive programmable array.

7. The logic gate array of claim 1, wherein the routing layer configures the first and second logic gate layers to perform the-required functions.

8. The logic gate array of claim 1, wherein the logic gate array is a non-volatile gate array.

9. An integrated circuit, comprising a central processing circuit layer, a sub processing circuit layer, a logic gate array layer, and a magnetic memory layer stacked on top of a silicon transistor layer, wherein all the layers are electrically connected by vias and the components in all the layers are magnetic devices, the magnetic devices are disposed in metal layers.

10. The integrated circuit of claim 9, wherein the central processing circuit layer is a central processing unit.

11. The integrated circuit of claim 9, wherein the sub processing circuit layer is a digital signal processing (DSP) unit.

12. The integrated circuit of claim 9, wherein the magnetic memory layer is a static random access memory (SRAM), a dynamic random access memory (DRAM), cache memory, hard drive, or flash memory.

13. The integrated circuit of claim 9, wherein the logic gate array layer is a magnetic adaptive programmable array (MAPA).

14. The integrated circuit of claim 13, wherein the MAPA implements a video driver circuit, and/or an audio driver circuit.

* * * * *